United States Patent
Lee et al.

(10) Patent No.: US 10,861,695 B2
(45) Date of Patent: Dec. 8, 2020

(54) METHOD OF FORMING A LOW-K LAYER AND METHOD OF FORMING A SEMICONDUCTOR DEVICE

(71) Applicant: Samsung Electronics Co., Ltd., Suwon-si (KR)

(72) Inventors: Sunyoung Lee, Yongin-si (KR); Minjae Kang, Osan-si (KR); Se-Yeon Kim, Hwaseong-si (KR); Teawon Kim, Hwaseong-si (KR); Yong-Suk Tak, Seoul (KR); Sunjung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/217,339

(22) Filed: Dec. 12, 2018

(65) Prior Publication Data

US 2019/0333754 A1    Oct. 31, 2019

(30) Foreign Application Priority Data

Apr. 26, 2018  (KR) .................. 10-2018-0048568

(51) Int. Cl.
| | |
|---|---|
| *H01L 21/00* | (2006.01) |
| *H01L 21/02* | (2006.01) |
| *C23C 16/36* | (2006.01) |
| *C23C 16/455* | (2006.01) |
| *H01L 21/28* | (2006.01) |
| *H01L 29/165* | (2006.01) |

(Continued)

(52) U.S. Cl.
CPC .......... *H01L 21/0228* (2013.01); *C23C 16/36* (2013.01); *C23C 16/45536* (2013.01); *C23C 16/45544* (2013.01); *H01L 21/02126* (2013.01); *H01L 21/02211* (2013.01); *H01L 21/02274* (2013.01); *H01L 21/28123* (2013.01); *H01L 29/165* (2013.01); *H01L 29/4983* (2013.01); *H01L 29/6656* (2013.01); *H01L 29/66545* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,962,876 B2 | 11/2005 | Ahn et al. | |
| 7,419,888 B2 | 9/2008 | Yang et al. | |
| 8,647,722 B2 | 2/2014 | Kobayashi et al. | |

(Continued)

OTHER PUBLICATIONS

Communication dated Aug. 26, 2019, issued by the European Patent Office in counterpart European Application No. 19171041.7.

*Primary Examiner* — Reema Patel
(74) *Attorney, Agent, or Firm* — Sughrue Mion, PLLC

(57) ABSTRACT

A method of forming a low-k layer includes forming a layer by providing a silicon source, a carbon source, an oxygen source, and a nitrogen source onto a substrate. The forming of the layer includes a plurality of main cycles, and each of the main cycles includes providing the silicon source, providing the carbon source, providing the oxygen source, and providing the nitrogen source, each of which is performed at least one time. Each of the main cycles includes sub-cycles in which the providing of the carbon source and the providing of the oxygen source are alternately performed.

19 Claims, 14 Drawing Sheets

(51) Int. Cl.
*H01L 29/49* (2006.01)
*H01L 29/66* (2006.01)

(56) References Cited

U.S. PATENT DOCUMENTS

| | | |
|---|---|---|
| 8,669,465 B2 | 3/2014 | Myong |
| 9,390,912 B2 | 7/2016 | Murakami et al. |
| 9,704,703 B2 | 7/2017 | Hashimoto et al. |
| 9,837,262 B2 | 12/2017 | Sasajima et al. |
| 2008/0206940 A1* | 8/2008 | Kang .............. H01L 21/823807 438/197 |
| 2014/0213067 A1 | 7/2014 | Murakami et al. |
| 2014/0273507 A1* | 9/2014 | Hirose .................... C23C 16/36 438/758 |
| 2015/0104574 A1 | 4/2015 | Lee et al. |
| 2016/0322218 A1 | 11/2016 | Fukiage et al. |
| 2017/0092489 A1 | 3/2017 | Ishizaka et al. |
| 2017/0186603 A1 | 6/2017 | Moon et al. |

* cited by examiner

METHOD OF FORMING A LOW-K LAYER AND METHOD OF FORMING A SEMICONDUCTOR DEVICE

CROSS-REFERENCE TO RELATED APPLICATION

This U.S. non-provisional patent application claims priority under 35 U.S.C. § 119 to Korean Patent Application No. 10-2018-0048568, filed on Apr. 26, 2018, in the Korean Intellectual Property Office, the disclosure of which is hereby incorporated by reference in its entirety.

BACKGROUND

Embodiments of the inventive concepts relate to a method of forming a layer and, more particularly, to a method of forming a low-k layer and a method of forming a semiconductor device.

Semiconductor devices are widely used in an electronic industry because of their small sizes, multi-functional characteristics, and low manufacture costs. Semiconductor devices may be categorized as any one of semiconductor memory devices storing logic data, semiconductor logic devices processing operations of logic data, and hybrid semiconductor devices performing various functions.

Highly integrated semiconductor devices have been increasingly demanded with the development of the electronic industry. However, various limitations (e.g., a margin reduction of an exposure process defining fine patterns) may be caused by the high integration density, and thus the manufacture of semiconductor devices may become more difficult by these limitations. In addition, high-speed semiconductor devices have been increasingly demanded with the development of the electronic industry. Thus, various researches are being conducted for new techniques capable of realizing highly integrated and/or high-speed semiconductor devices.

SUMMARY

Embodiments of the inventive concepts may provide a method of forming a low-k layer, which is capable of increasing both a carbon composition and an oxygen composition.

Embodiments of the inventive concepts may also provide a method of forming a semiconductor device, which is capable of improving etch resistance and of improving electrical characteristics of the semiconductor device.

In an aspect, a method of forming a low-k layer may include forming a layer by providing a silicon source, a carbon source, an oxygen source, and a nitrogen source onto a substrate, wherein forming of the layer includes a plurality of main cycles, wherein each of the main cycles includes providing the silicon source, providing the carbon source, providing the oxygen source, and providing the nitrogen source, each of which is performed at least one time, and wherein each of the main cycles includes sub-cycles in which the providing of the carbon source and the providing of the oxygen source are alternately performed.

In another aspect, a method of forming a low-k layer may include forming a layer by providing a silicon source, a carbon source, an oxygen source, and a nitrogen source onto a substrate, wherein the forming of the layer includes a plurality of main cycles, wherein each of the main cycles includes providing the silicon source, performing a plurality of sub-cycles, and providing the nitrogen source, which are sequentially performed, and wherein each of the sub-cycles includes providing the carbon source and providing the oxygen source.

In another aspect, a method of forming a semiconductor device includes forming gate patterns on a substrate, forming a gate spacer layer covering the gate patterns, and forming gate spacers by etching the gate spacer layer, wherein the forming of the gate spacer layer includes a plurality of main cycles, wherein each of the main cycles may include providing a silicon source, providing a carbon source, providing an oxygen source, and providing a nitrogen source, each of which is performed at least one time, and wherein each of the main cycles includes sub-cycles in which the providing of the carbon source and the providing of the oxygen source are alternately performed.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings.

Figure 1:
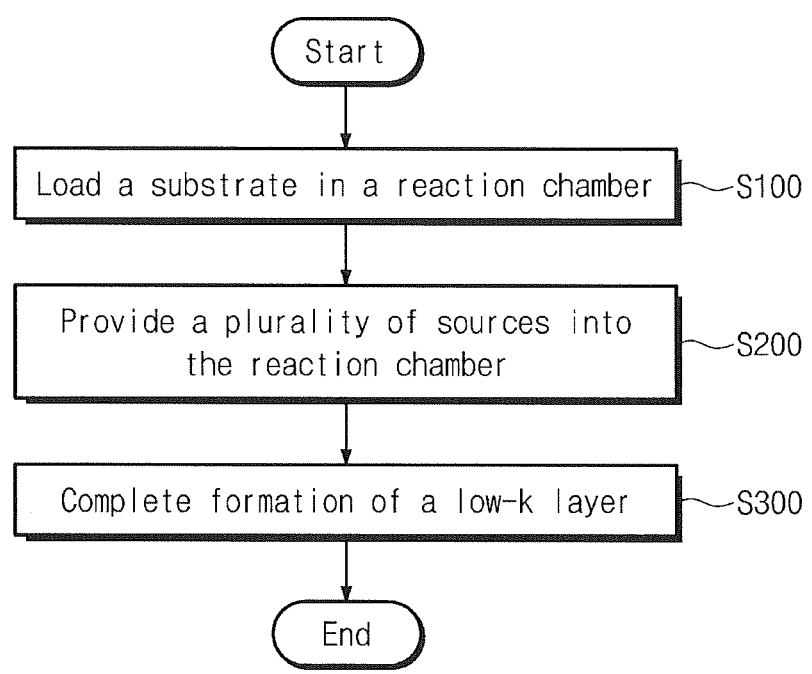
FIG. 1 is a flowchart illustrating a method of forming a layer, according to some embodiments of the inventive concepts.
Figure 2:
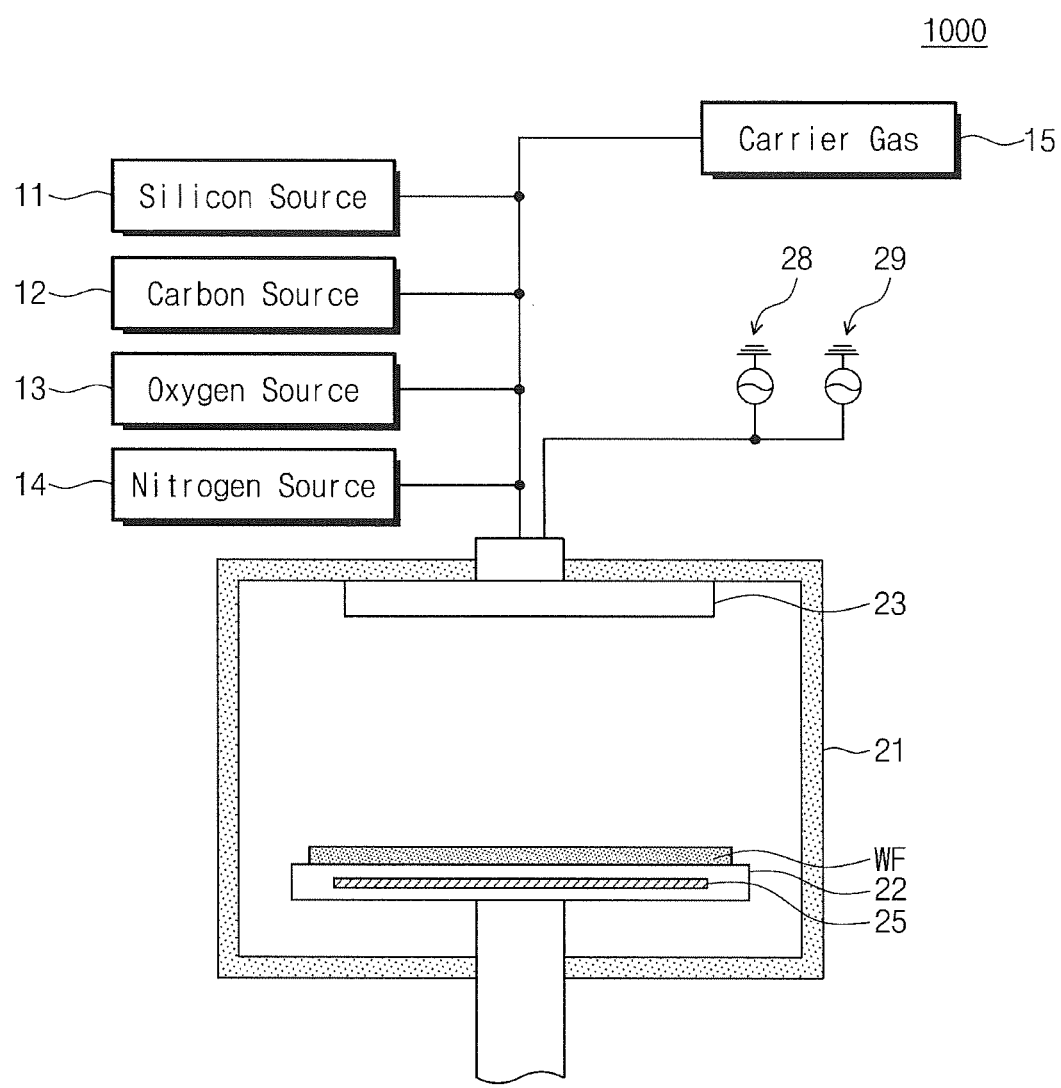
FIG. 2 is a conceptual view illustrating a deposition apparatus for forming a layer according to some embodiments of the inventive concepts.

FIG. 1 is a flowchart illustrating a method of forming a layer, according to some embodiments of the inventive concepts. FIG. 2 is a conceptual view illustrating a deposition apparatus 1000 for forming a layer according to some embodiments of the inventive concepts.

Referring to FIGS. 1 and 2, the deposition apparatus 1000 may include a reaction chamber 21. In some embodiments, the deposition apparatus 1000 may be a plasma enhanced atomic layer deposition (PEALD) apparatus. The deposition apparatus 1000 may also include a stage 22 which is provided in the reaction chamber 21 and on which a substrate WF is loaded, and a shower head 23 which is used to provide reaction or process gases into the reaction chamber 21. The stage 22 may include a heater 25 therein to maintain the substrate WF at a desired temperature. High radio frequency (HRF) power 28 of about 13.56 MHz or about 27 MHz may be applied to the shower head 23 (or a top electrode connected to the shower head 23) and the stage 22 may be grounded, and thus plasma may be formed between the shower head 23 and the stage 22. In some embodiments, when the plasma is formed, low radio frequency (LRF) power 29 of about 5 MHz or less (e.g., about 400 kHz to about 500 kHz) may be additionally applied to the shower head 23 or the top electrode as needed.

Process gases may be provided into the reaction chamber 21 through the shower head 23. In some embodiments, the shower head 23 may be connected to a silicon source 11, a carbon source 12, an oxygen source 13, and a nitrogen source 14 through a plurality of supply lines. A carrier gas supply unit 15 may be connected to the shower head 23. The silicon source 11, the carbon source 12, the oxygen source 13, and the nitrogen source 14 may be provided to the shower head 23 through individual supply lines separated from each other. Alternatively, at least some of the individual supply lines may overlap with each other.

A carrier gas provided from the carrier gas supply unit 15 may carry another source and/or a precursor into the reaction chamber 21. The carrier gas may purge an unreacted material and/or reaction byproducts in the reaction chamber 21. The carrier gas may be an inert gas such as helium (He) or neon (Ne) or may be a gas having very low reactivity, such as nitrogen ($N_2$) or carbon dioxide ($CO_2$). However, embodiments of the inventive concepts are not limited thereto. At least a portion of the supply line of the carrier gas supply unit 15 may overlap with the supply lines of the silicon source 11, the carbon source 12, the oxygen source 13, and the nitrogen source 14. Alternatively, the supply line of the carrier gas supply unit 15 may be separated from the supply lines of the silicon source 11, the carbon source 12, the oxygen source 13, and the nitrogen source 14.

A substrate WF may be loaded on the stage 22 in the reaction chamber 21 (S100). The substrate WF may be a wafer. A plurality of sources may be provided into the reaction chamber 21 to form a low-k layer on the substrate WF (S200). After the low-k layer is formed with a desired thickness, the process of forming the low-k layer may be completed (S300). Thereafter, the substrate WF may be unloaded from the reaction chamber 21. A low-k layer may be a layer having a dielectric constant is less than about 8. It will further be appreciated that a low-k layer may be a layer having a low or small dielectric constant relative to a silicon oxide or silicon dioxide. Accordingly, in some embodiments, the low-k layer may have a dielectric constant less than about 7, less than about 6, less than about 5.0, less than about 4.5, less than about 4.2, less than about 4.0, less than about 3.9 (the dielectric constant for silicon dioxide), less than about 3.7, less than about 3.5, less than about 3.0, less than about 2.5, less than about 2.2, or less than about 2.0.

[Silicon Source]

The silicon source 11 may be a silane-based silicon precursor substituted with a halogen, such as monofluorosilane ($SiFH_3$), difluorosilane ($SiF_2H_2$), trifluorosilane ($SiF_3H$), tetrafluorosilane ($SiF_4$), monofluorodisilane ($Si_2FH_5$), difluorodisilane ($Si_2F_2H_4$), trifluorodisilane ($Si_2F_3H_3$), tetrafluorodisilane ($Si_2F_4H_2$), pentafluorodisilane ($Si_2F_5H$), hexafluorodisilane ($Si_2F_6$), monochlorosilane ($SiClH_3$), dichlorosilane ($SiCl_2H_2$), trichlorosilane ($SiCl_3H$), tetrachlorosilane ($SiCl_4$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentachlorodisilane ($Si_2Cl_5H$), hexachlorodisilane ($Si_2Cl_6$), monobromosilane ($SiBrH_3$), dibromosilane ($SiBr_2H_2$), tribromosilane ($SiBr_3H$), tetrabromosilane ($SiBr_4$), monobromodisilane ($Si_2BrH_5$), dibromodisilane ($Si_2Br_2H_4$), tribromodisilane ($Si_2Br_3H_3$), tetrabromodisilane ($Si_2Br_4H_2$), pentabromodisilane ($Si_2Br_5H$), hexabromodisilane ($Si_2Br_6$), monoiodosilane ($SiIH_3$), diiodosilane ($SiI_2H_2$), triiodosilane ($SiI_3H$), tetraiodosilane ($SiI_4$), monoiododisilane ($Si_2IH_5$), diiododisilane ($Si_2I_2H_4$), triiododisilane ($Si_2I_3H_3$), tetraiododisilane ($Si_2I_4H_2$), pentaiododisilane ($Si_2I_5H$), or hexaiododisilane ($Si_2I_6$).

Alternatively, the silicon source 11 may be, but not limited to, diethylsilane ($Et_2SiH_2$), tetraethyl orthosilicate ($Si(OCH_2CH_3)_4$, TEOS), or an alkyl aminosilane-based compound. For example, the alkyl aminosilane-based compound may include, but not limited to, diisopropylaminosilane ($H_3Si(N(i-Pr)_2)$), bis(tertiary-butylamino)silane (($C_4Hg(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), tris(dimethylhydrazino)silane ($HSi(N(H)NMe_2)_3$), bis(diethylamino)silane ($H_2Si(NEt_2)_2$), bis(diisopropylamino)silane ($H_2Si(N(i-Pr)_2)_2$), tris(isopropylamino)silane ($HSi(N(i-Pr)_2)_3$), or (diisopropylamino)silane ($H_3Si(N(i-Pr)_2)$).

As set forth herein, 'Me' denotes a methyl group, 'Et' denotes an ethyl group, and 'i-Pr' denotes an isopropyl group.

[Carbon Source]

The carbon source 12 may include one selected from a group consisting of alkane having a carbon number of 1 to about 10, alkene having a carbon number of 2 to about 10, alkylamine having a carbon number of 1 to about 15, a nitrogen-containing heterocyclic compound having a carbon number of about 4 to about 15, alkylsilane having a carbon number of 1 to about 20, alkoxysilane having a carbon number of 1 to about 20, alkylsiloxane having a carbon number of 1 to about 20, and a combination thereof.

The alkane having the carbon number of 1 to about 10 may be methane, ethane, propane, butane (all isomers), pentane (all isomers), hexane (all isomers), heptane (all isomers), octane (all isomers), nonane (all isomers), decane (all isomers), or a combination thereof.

The alkene having the carbon number of 2 to about 10 may be ethylene, propylene, butene (all isomers), pentene (all isomers), hexene (all isomers), heptene (all isomers), octene (all isomers), nonene (all isomers), decene (all isomers), or a combination thereof. The alkylamine having the carbon number of 1 to about 15 may be expressed by, for example, a chemical formula of $NR^1R^2R^3$. Here, $R^1$, $R^2$, and $R^3$ may be each independently selected from a group consisting of hydrogen, a halogen, alkyl having a carbon number of 1 to about 10, alkenyl having a carbon number of 1 to about 10, alkylamino having a carbon number of 1 to about 10, aryl having a carbon number of about 6 to about 12, arylalkyl having a carbon number of about 7 to about 12, alkylaryl having a carbon number of about 7 to about 12, cycloalkyl having a carbon number of 3, and in some embodiments, about 5, to about 12, and any combination thereof. At this time, at least one of $R^1$, $R^2$, or $R^3$ is alkyl having a carbon number of 1 to about 10. In some embodiments, two of $R^1$, $R^2$, and $R^3$ may be connected to each other to form a ring or loop shape. In some embodiments, two or more alkylamines may be connected to each other to form alkyldiamine or alkyltriamine, and these may be included therein.

[Oxygen Source, Nitrogen Source]

The oxygen source 13 may be, for example, $O_3$, $H_2O$, $O_2$, $NO_2$, NO, $N_2O$, alcohol, metal alkoxide, plasma $O_2$, remote plasma $O_2$, plasma $N_2O$, plasma $H_2O$, or a combination thereof. The nitrogen source 14 may be, for example, $N_2$, $NH_3$, hydrazine ($N_2H_4$), plasma $N_2$, remote plasma $N_2$, or a combination thereof.

A sequence in which the process gases described above are provided into the reaction chamber 21 to form the low-k layer will be described hereinafter. The low-k layer may be a SiOCN layer.

Figure 3:
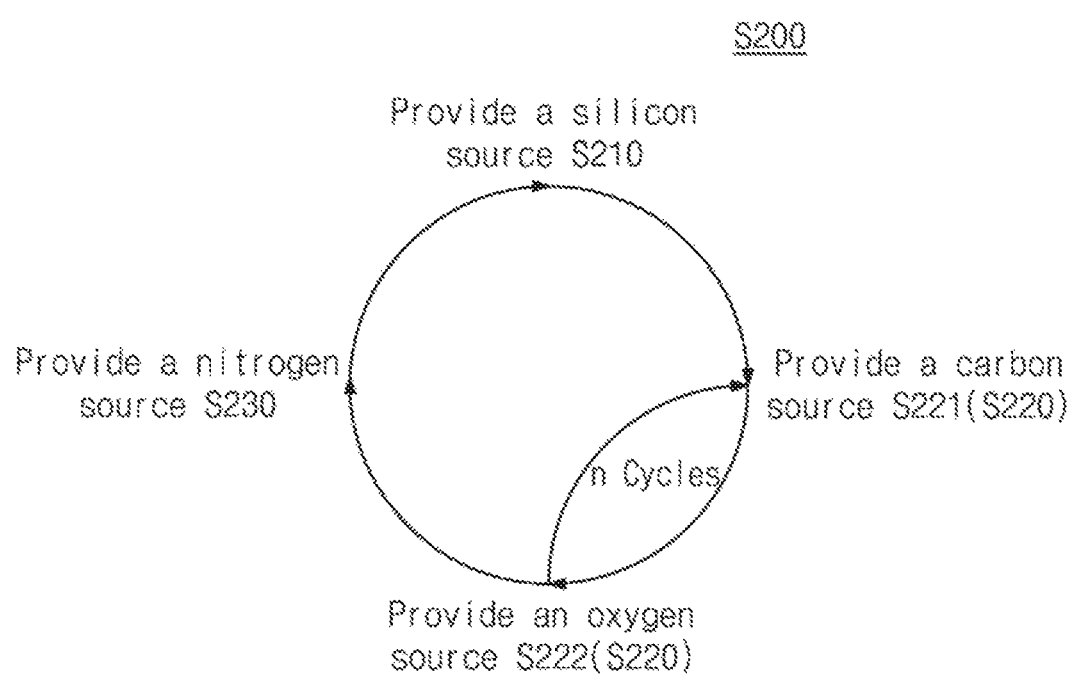
FIG. 3 is a conceptual diagram illustrating a sequence of providing process gases according to some embodiments of the inventive concepts.
Figure 4:
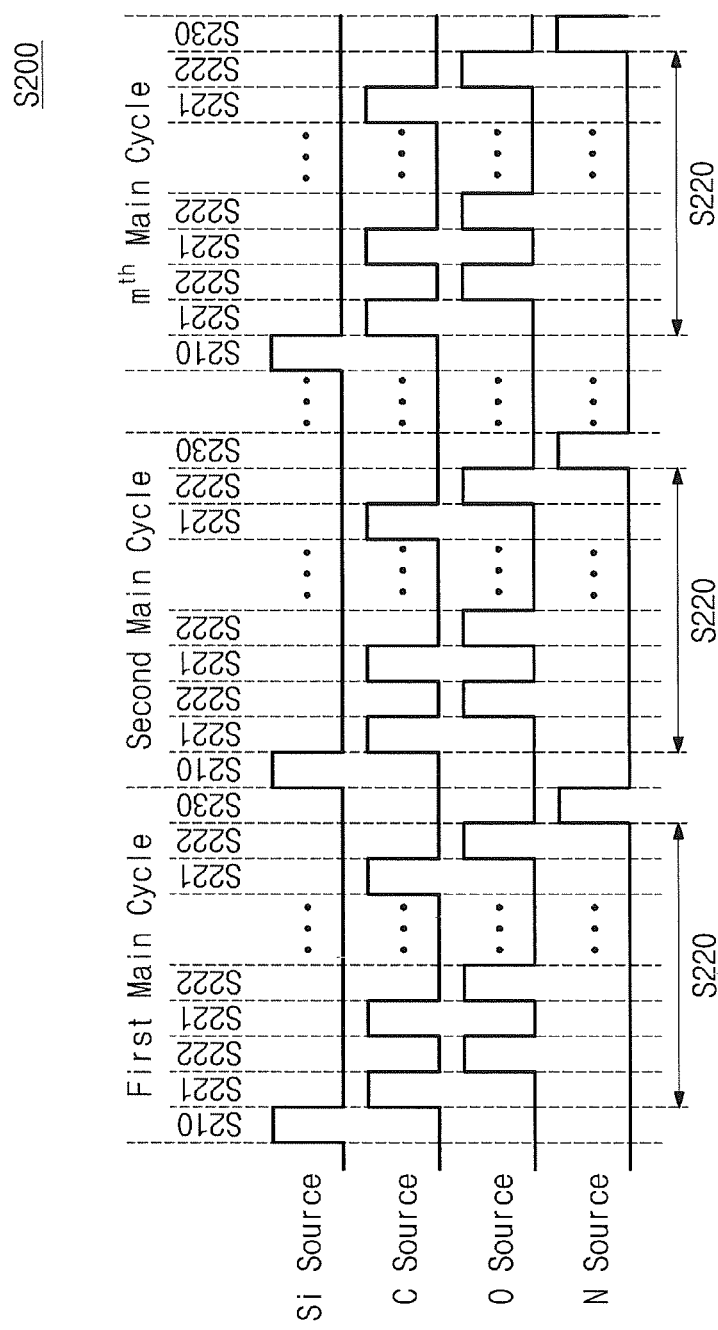
FIG. 4 is a timing diagram illustrating a cycle of providing process gases according to some embodiments of the inventive concepts.
Figure 5:
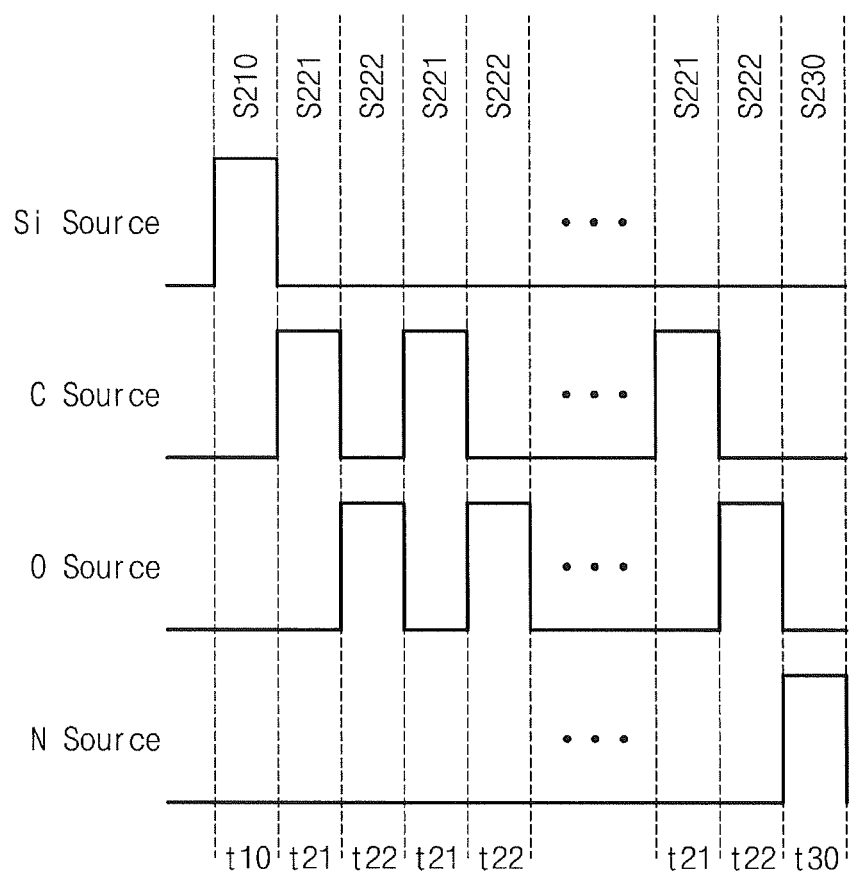
FIG. 5 is a timing diagram illustrating a performance time of one of cycles of FIG. 4.

FIG. 3 is a conceptual diagram illustrating a sequence of providing process gases according to some embodiments of the inventive concepts. FIG. 4 is a timing diagram illustrating a cycle of providing process gases according to some embodiments of the inventive concepts. FIG. 5 is a timing diagram illustrating a performance time of one of cycles of FIG. 4.

Referring to FIGS. 3 to 5, the process S200 of providing the plurality of sources into the reaction chamber 21 of FIG. 2 to form the low-k layer may include an operation S210 of providing the silicon source, sub-cycles S220 of providing the carbon and oxygen sources, and an operation S230 of providing the nitrogen source. In some embodiments, the process S200 of forming the low-k layer may include a main cycle that includes the operation S210 of providing the silicon source, an operation S221 of providing the carbon source, an operation S222 of providing the oxygen source, and the operation S230 of providing the nitrogen source, each of which is performed at least one or more times. The main cycle may be performed a plurality of times. For example, the low-k layer may be formed by performing m main cycles, as illustrated in FIG. 4. The number m of the main cycles may be determined depending on a desired thickness of the low-k layer. For example, the number m of the main cycles may range from about 5 to about 20.

In each of the main cycles, the operation S210 of providing the silicon source, the sub-cycles S220, and the operation S230 of providing the nitrogen source may be sequentially performed. In the present specification, a starting point of each of the main cycles is defined as a starting point of the operation S210 of providing the silicon source. Hereinafter, one main cycle will be mainly described for the purpose of ease and convenience in explanation.

First, the operation S210 of providing the silicon source may be performed. In the operation S210 of providing the silicon source, at least one of the silicon sources described above may be provided into the reaction chamber 21 of FIG. 2. For example, when hexachlorodisilane (HCD) is provided as the silicon source, chemical bond of two silicon atoms of hexachlorodisilane may be dissociated, and the two silicon atoms may be bonded to the substrate.

Thereafter, the sub-cycles S220 of providing the carbon and oxygen sources may be performed. Each of the sub-cycles S220 may include one operation S221 of providing the carbon source and one operation S222 of providing the oxygen source. For example, the number n of the sub-cycles may range from 5 to 30. In some embodiments, the number of the sub-cycles of one of the main cycles may be different from the number(s) of the sub-cycles of other(s) of the main cycles. Alternatively, the numbers of the sub-cycles of the main cycles may be equal to each other.

The operation S221 of providing the carbon source may be performed. In the operation S221 of providing the carbon source, at least one of the carbon sources described above may be provided into the reaction chamber 21 of FIG. 2. For example, a source represented as $C_xH_y$ (where 'x' and 'y' are constants, e.g., $C_3H_6$) may be provided as the carbon source. The carbon source may be chemically bonded to the silicon atoms which are bonded to the substrate by the operation S210 of providing the silicon source. Thereafter, the operation S222 of providing the oxygen source may be performed. In the operation S222 of providing the oxygen source, at least one of the oxygen sources described above may be provided into the reaction chamber 21 of FIG. 2. For example, $O_2$ may be provided as the oxygen source.

The carbon sources bonded to the silicon atoms may have a relatively long carbon bonding structure and thus may cause steric hindrance which hinders the subsequently provided oxygen source from being adsorbed on the substrate. In other words, sites to which oxygen atoms are bonded may be reduced by the steric hindrance, and thus it may be difficult to increase an oxygen concentration in the low-k layer even though a time of providing the oxygen source increases. In addition, a degree of the steric hindrance may be affected by an extent to which the carbon source is provided, and thus it may not be easy to increase both a carbon concentration and the oxygen concentration in the low-k layer. The carbon concentration (or a carbon content) in the low-k layer may affect a resistance of the low-k layer to a wet etching process. If the resistance of the low-k layer to the wet etching process is lower than a desired level, it may be difficult to use the low-k layer as a spacer of a gate electrode. The oxygen concentration (or an oxygen content) in the low-k layer may affect a dielectric constant of the low-k layer. If the dielectric constant is greater than a desired level, a parasitic capacitance may be increased, and thus electrical characteristics of a semiconductor device may be deteriorated.

However, according to some embodiments of the inventive concepts, the providing of the carbon source and the providing of the oxygen source may be repeatedly performed by a plurality of the sub-cycles S220. Both the carbon concentration and the oxygen concentration in the low-k layer may be increased by the sub-cycles S220. A portion of the provided oxygen may be bonded to carbon bonded to the substrate and may be removed from the substrate in the form of CO or $CO_2$. Thus, the steric hindrance may be temporarily reduced and/or removed. As a result, oxygen may be easily bonded to the substrate. In addition, long carbon bonding structures combined with silicon may be changed into a larger number of relatively short carbon bonding structures. Thus, the carbon concentration and the oxygen concentration in the low-k layer may be increased at the same time.

Other sources such as the silicon source and the nitrogen source may not be provided between the operation S221 of providing the carbon source and the operation S222 of providing the oxygen source in one sub-cycle. In addition, the other sources may not be provided between the sub-cycles. In some embodiments, a performance time t22 of the operation S222 of providing the oxygen source may range from about 3 seconds to about 15 seconds. A performance time t21 of the operation S221 of providing the carbon source may range from about 3 seconds to about 100 seconds. A performance time t10 of the operation S210 of providing the silicon source may range from about 3 seconds to about 50 seconds. The performance time t22 of the operation S222 of providing the oxygen source may be shorter than the performance time t21 of the operation S221 of providing the carbon source. The performance time t22 of the operation S222 of providing the oxygen source may be shorter than the performance time t10 of the operation S210 of providing the silicon source.

After the sub-cycles S220 are completed, the operation S230 of providing the nitrogen source may be performed. In the operation S230 of providing the nitrogen source, at least one of the nitrogen sources described above may be provided into the reaction chamber 21 of FIG. 2. For example, $NH_3$ may be provided as the nitrogen source. A performance time t30 of the operation S230 of providing the nitrogen source may range from about 3 seconds to about 50 seconds. In some embodiments, the performance time t30 of the operation S230 of providing the nitrogen source may be longer than the performance time t22 of the operation S222 of providing the oxygen source. The performance time t30 of the operation S230 of providing the nitrogen source may be shorter than the performance time t21 of the operation S221 of providing the carbon source.

Although not shown in FIGS. 3 to 5, a purge operation may be performed between operations of providing the sources. A purge gas used in the purge operation may be an inert gas such as helium (He) or neon (Ne) or may be a gas having very low reactivity, such as nitrogen ($N_2$) or carbon dioxide ($CO_2$). However, embodiments of the inventive concepts are not limited thereto.

At least one of the operations of providing the silicon source, the carbon source, the oxygen source, and the nitrogen source may include activating each of the sources by plasma. In other words, when a temperature of the reaction chamber is relatively low, the RF power for forming the plasma may be provided to the deposition apparatus, and thus energy necessary for forming the low-k layer may be provided. In some embodiments, the RF power for forming the plasma may be provided in one or two of the operations of providing the silicon source, the carbon source, the oxygen source, and the nitrogen source. In certain embodiments, the RF power for forming the plasma may be provided in each of the operations of providing the silicon source, the carbon source, the oxygen source, and the nitrogen source.

The process of forming the low-k layer may be performed at a temperature of about 400° C. to about 700° C., and in some embodiments, at a relatively low temperature of about 450° C. to about 630° C. In some embodiments, the process of forming the low-k layer may be performed at a temperature of about 500° C. or less in accordance with a particular carbon source.

The low-k layer may be a SiOCN layer. A carbon composition and an oxygen composition of the SiOCN layer may have a relationship expressed by Equation 1.

$$\text{Carbon composition (at \%)} \geq 21.6 - 0.4 \times (\text{oxygen composition (at \%)}) \quad [\text{Equation 1}]$$

A sum of the carbon composition and the oxygen composition of the SiOCN layer may range from about 35 at % to about 50 at %. For example, compositions of the SiOCN layer may be analyzed by X-ray photoelectron spectroscopy (XPS). The low-k layer formed according to some embodiments of the inventive concepts may have a high resistance to a wet etching process by its high carbon composition and may also have a low dielectric constant by its high oxygen composition. In some embodiments, the low-k layer formed according to some embodiments of the inventive concepts may have a dielectric constant of about 5.0 or less.

Figure 6:
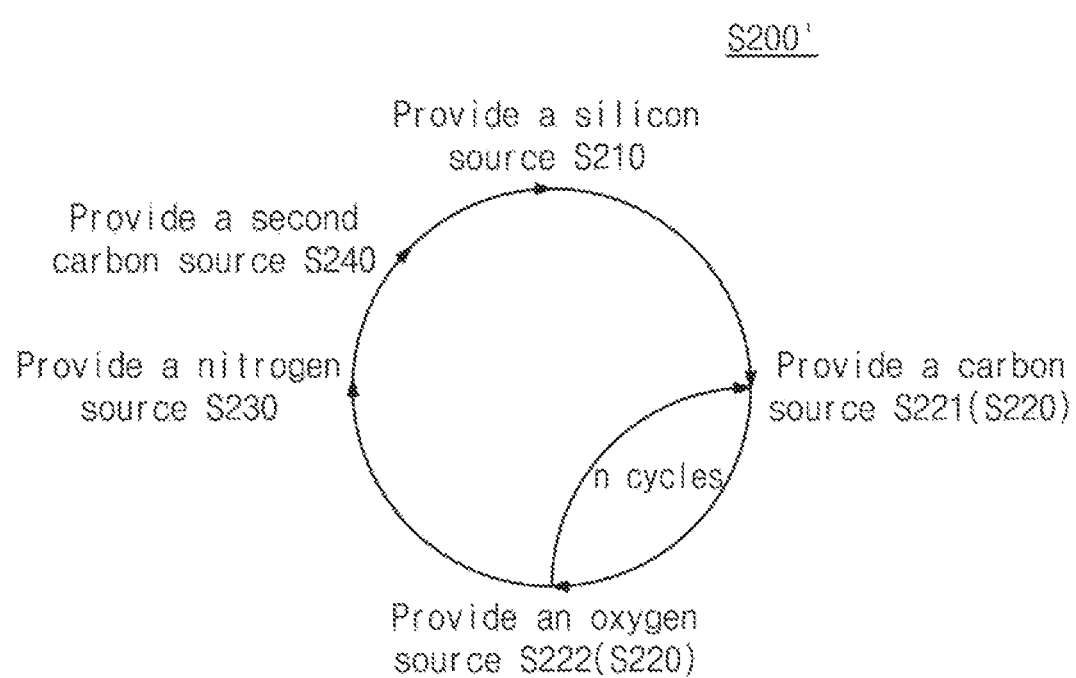
FIG. 6 is a conceptual diagram illustrating a sequence of providing process gases according to some embodiments of the inventive concepts.
Figure 7:
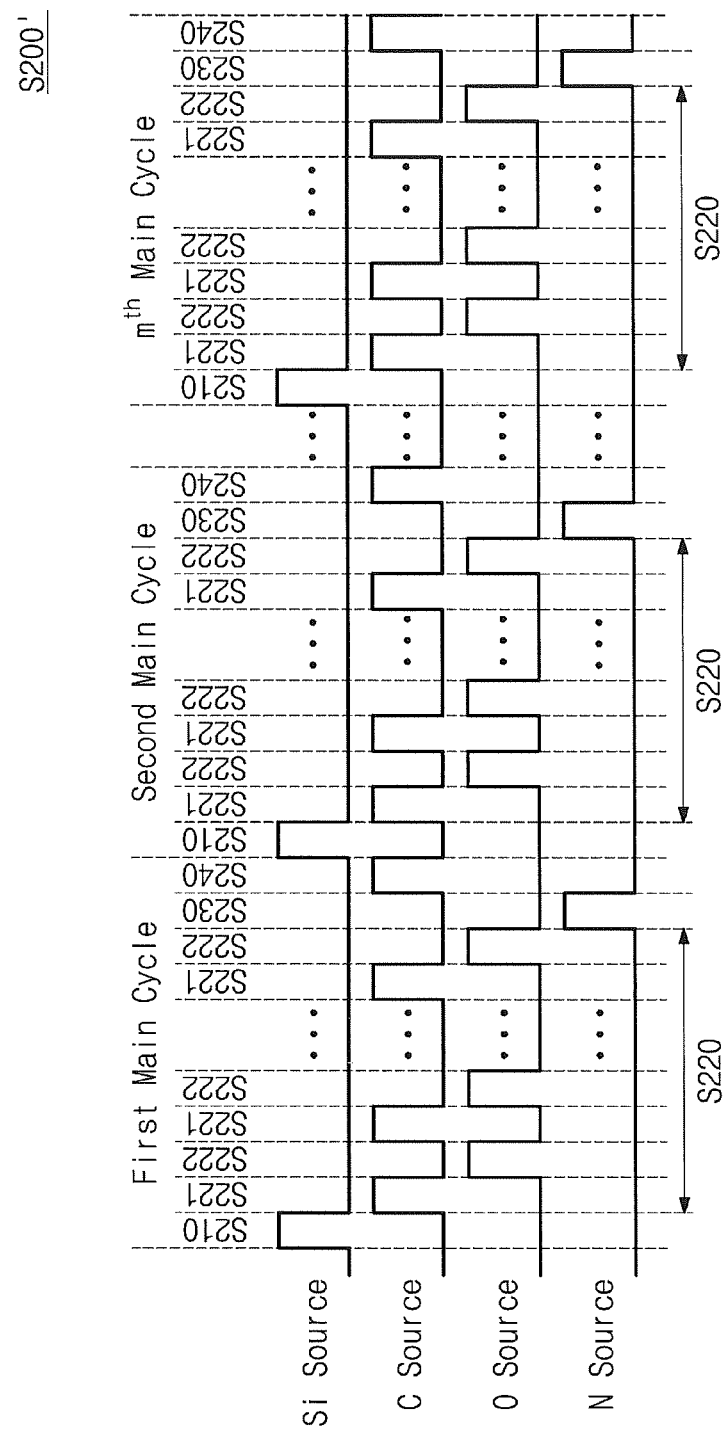
FIG. 7 is a timing diagram illustrating a cycle of providing process gases according to some embodiments of the inventive concepts.
Figure 8:
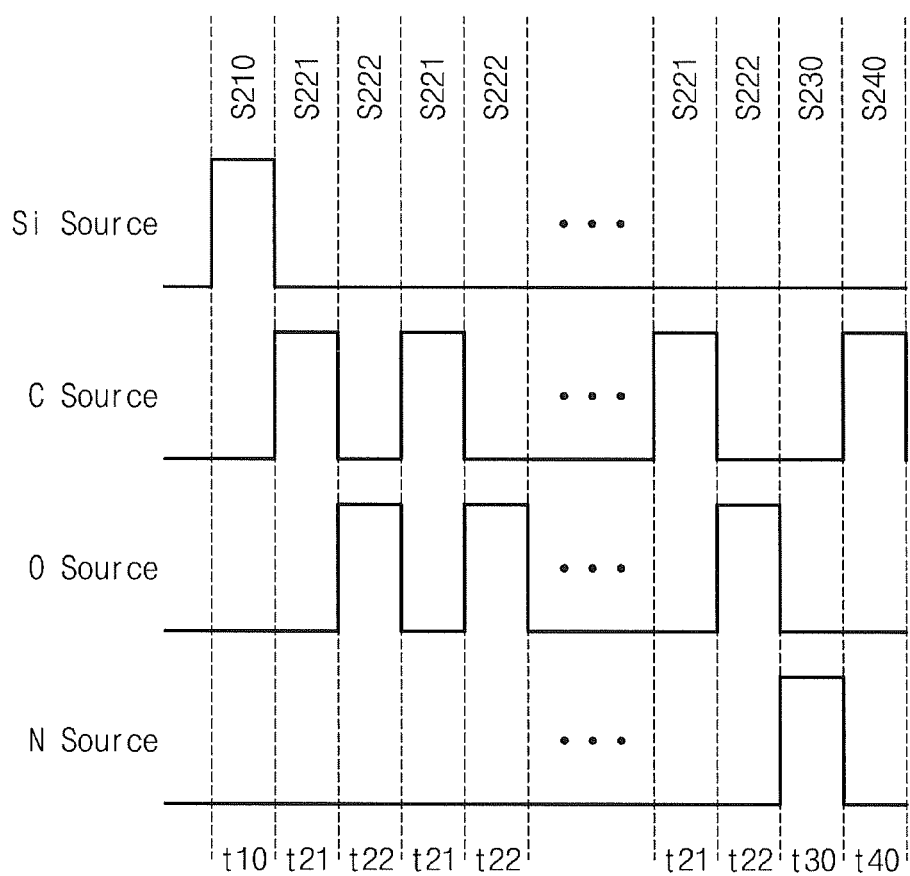
FIG. 8 is a timing diagram illustrating a performance time of one of cycles of FIG. 6.

FIG. 6 is a conceptual diagram illustrating a sequence of providing process gases according to some embodiments of the inventive concepts. FIG. 7 is a timing diagram illustrating a cycle of providing process gases according to some embodiments of the inventive concepts. FIG. 8 is a timing diagram illustrating a performance time of one of cycles of FIG. 7. Hereinafter, the descriptions to the same components as in the above embodiments will be omitted or mentioned briefly for the purpose of ease and convenience in explanation.

Referring to FIGS. 6 to 8, a process S200' of providing a plurality of sources into the reaction chamber 21 of FIG. 2 to form a low-k layer may include the operation S210 of providing the silicon source, the sub-cycles S220 of providing the carbon and oxygen sources, and the operation S230 of providing the nitrogen source. In some embodiments, the process S200' of forming the low-k layer may include a main cycle that includes the operation S210 of providing the silicon source, the operation S221 of providing the carbon source, the operation S222 of providing the oxygen source, and the operation S230 of providing the nitrogen source, each of which is performed at least one or more times. The main cycle may be performed a plurality of times.

In the present embodiment, the main cycle may further include an operation S240 of providing a second carbon source, which is performed after the operation S230 of providing the nitrogen source. A performance time t40 of the operation S240 of providing the second carbon source may be different from the performance time t21 of the operation S221 of providing the carbon source in the sub-cycles S220. For example, the performance time t40 of the operation S240 of providing the second carbon source may be longer than the performance time t21 of the operation S221 of providing the carbon source in the sub-cycles S220. For example, the performance time t40 of the operation S240 of providing the second carbon source may range from about 10 seconds to about 150 seconds.

Figure 9:
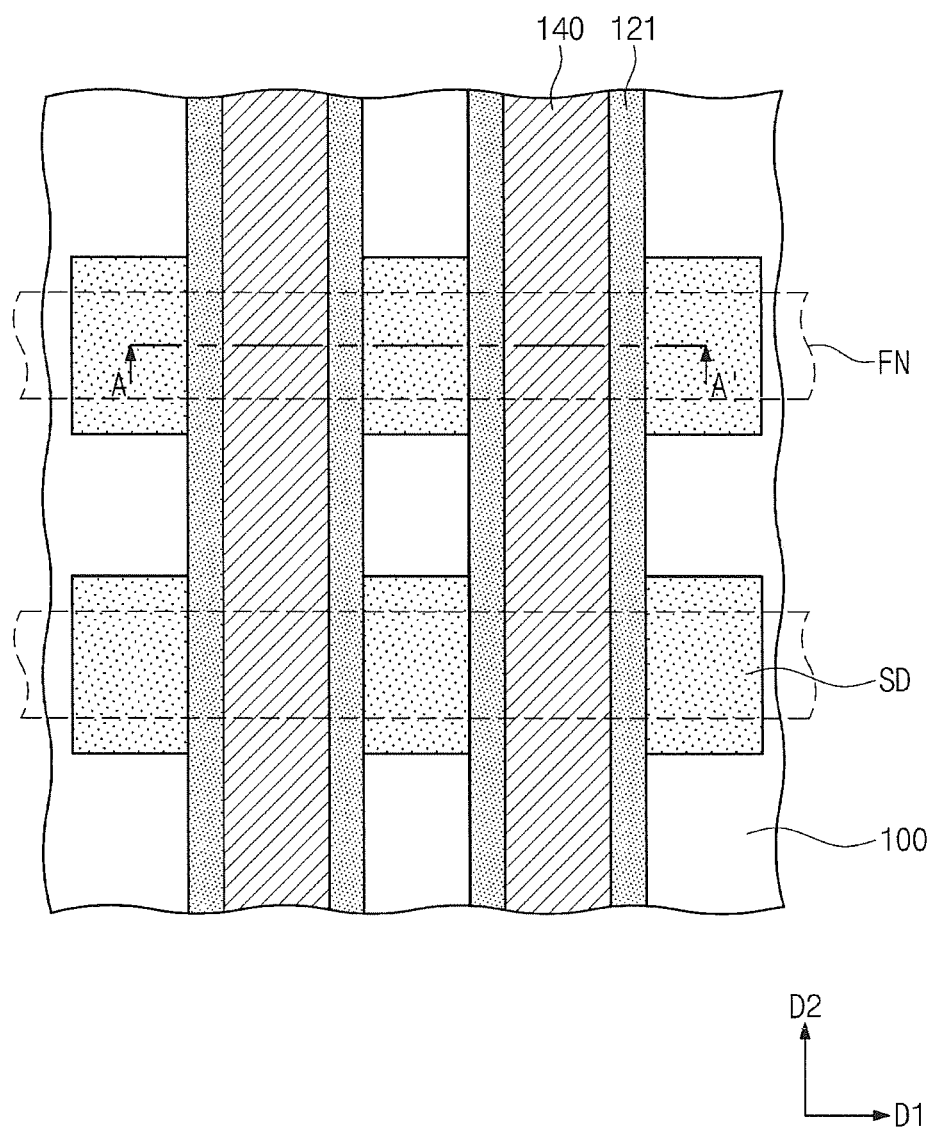
FIG. 9 is a plan view illustrating a semiconductor device according to some embodiments of the inventive concepts.

FIG. 9 is a plan view illustrating a semiconductor device according to some embodiments of the inventive concepts. FIGS. 10 to 15 are cross-sectional views taken along a line A-A' of FIG. 9 to illustrate a method of forming a semiconductor device, according to some embodiments of the inventive concepts.

Figure 10:
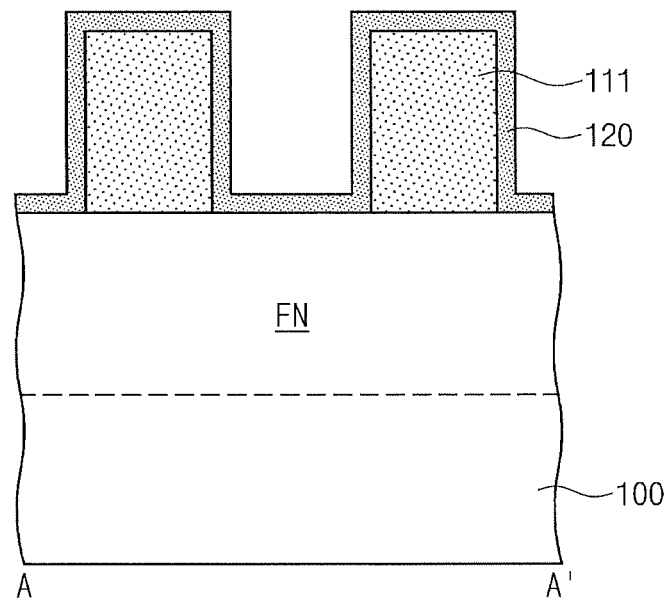
FIGS. 10 to 15 are cross-sectional views taken along a line A-A' of FIG. 9 to illustrate a method of forming a semiconductor device, according to some embodiments of the inventive concepts.

Referring to FIGS. 9 and 10, fin structures FN may be formed on a substrate 100. For example, the substrate 100 may be a silicon substrate, a germanium substrate, or a silicon-on-insulator (SOI) substrate. The fin structures FN may extend in a first direction D1 and may be spaced apart from each other in a second direction D2 intersecting the first direction D1. The formation of the fin structures FN may include patterning an upper portion of the substrate 100 to form trenches in the substrate 100. Thereafter, a device isolation layer may be formed in lower portions of the trenches between the fin structures FN. For example, the device isolation layer may include a silicon oxide layer.

Gate patterns 111 extending in the second direction D2 may be formed on the fin structures FN. The gate patterns 111 may include poly-silicon. The formation of the gate patterns 111 may include forming mask patterns on a poly-silicon layer, and performing an etching process on the poly-silicon layer by using the mask patterns as etch masks. The mask patterns may include a silicon nitride layer or a silicon oxynitride layer. Portions of the mask patterns may remain on the gate patterns 111.

A gate spacer layer 120 may be formed on the substrate 100 having the gate patterns 111. The gate spacer layer 120 may include a low-k layer formed by the method described with reference to FIGS. 1 to 8. For example, the gate spacer layer 120 may include a SiOCN layer. The gate spacer layer 120 may conformally cover the gate patterns 111 and the fin structures FN exposed between the gate patterns 111.

Figure 11:
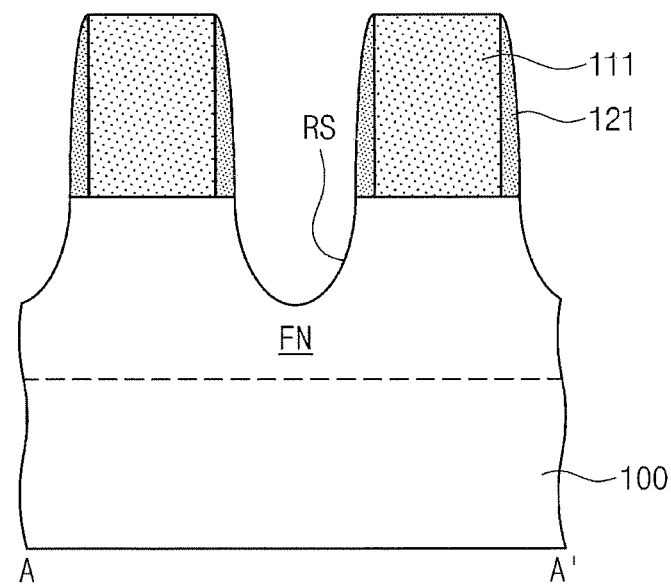

Referring to FIGS. 9 and 11, recess regions RS may be formed between the gate patterns 111. At this time, a portion of the gate spacer layer 120 may also be etched to expose the substrate 100 (more particularly, the recess regions RS). As a result, gate spacers 121 may be formed. The recess regions RS may be formed using a wet etching process and/or a dry etching process. For example, an etchant including hydrofluoric acid (HF) may be used during the process of forming the recess regions RS. The gate patterns 111 (or the mask patterns thereon) may be exposed during the formation of the recess regions RS.

Figure 12:
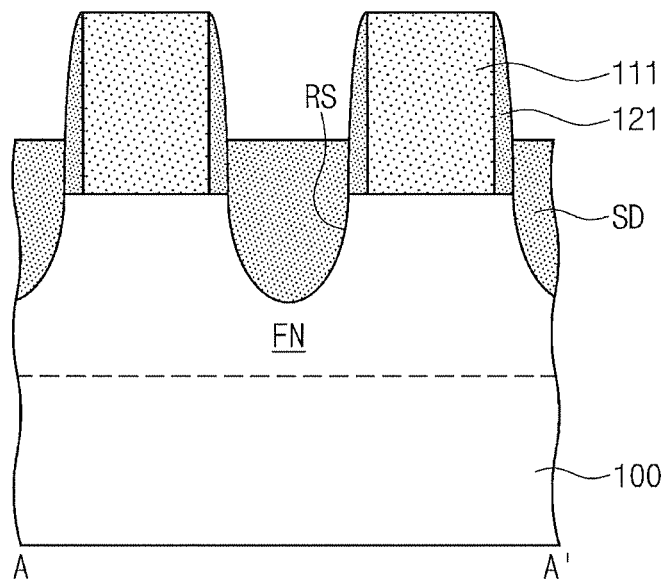

Referring to FIGS. 9 and 12, a process of removing a natural oxide layer formed on exposed surfaces of the recess regions RS may be performed. The process of removing the natural oxide layer may include a cleaning process. Thereafter, source/drain regions SD may be formed in the recess regions RS. The source/drain regions SD may be formed by an epitaxial process using the exposed surfaces of the recess regions RS as a seed. The source/drain regions SD may be formed of the same material as the substrate 100. Alternatively, the source/drain regions SD may be formed of a material that provides compressive strain or tensile strain to the fin structures FN. For example, when the substrate 100 is a silicon substrate, the source/drain regions SD may include a silicon carbide (SiC) layer having a lattice constant less than that of silicon, or a silicon-germanium (SiGe) layer having a lattice constant greater than that of silicon.

Figure 13:
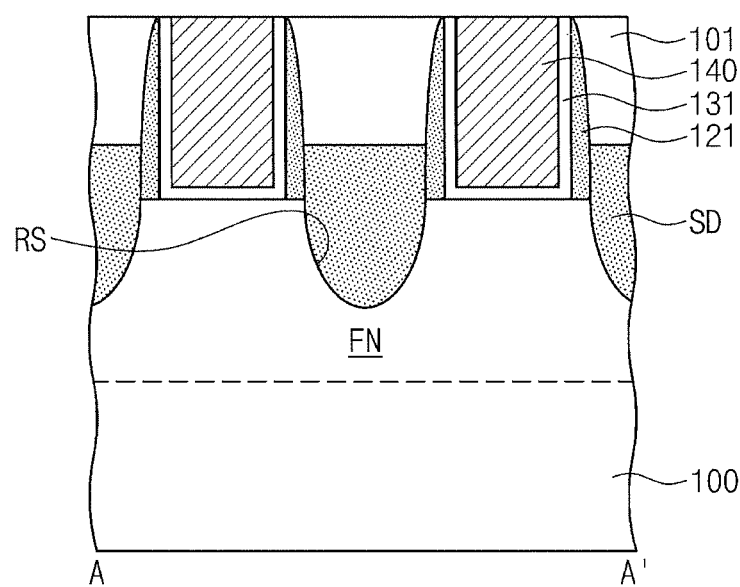

Referring to FIGS. 9 and 13, the gate patterns 111 may be removed, and then, gate insulating patterns 131 and gate electrodes 140 may be formed. A first interlayer insulating layer 101 may be formed before the removal of the gate patterns 111. The first interlayer insulating layer 101 may cover the source/drain regions SD and may expose the gate patterns 111. For example, the first interlayer insulating layer 101 may include a silicon oxide layer.

The process of removing the gate patterns 111, the process of forming the recess regions RS of FIG. 11 and the process of removing the natural oxide layer of FIG. 12 may be performed using etching processes. The gate spacers 121 according to some embodiments of the inventive concepts may have the high carbon concentration and thus may have a high etch resistance when the etching processes are performed.

The gate insulating patterns 131 may be formed of at least one of a silicon oxide layer, a silicon oxynitride layer, or a high-k layer having a dielectric constant higher than that of a silicon oxide layer. In some embodiments, an interface layer may be formed by thermal oxidation and/or chemical oxidation before the formation of the gate insulating patterns 131. The gate electrodes 140 may be formed of a metal material such as titanium, tantalum, tungsten, and/or any conductive nitride thereof.

Figure 14:
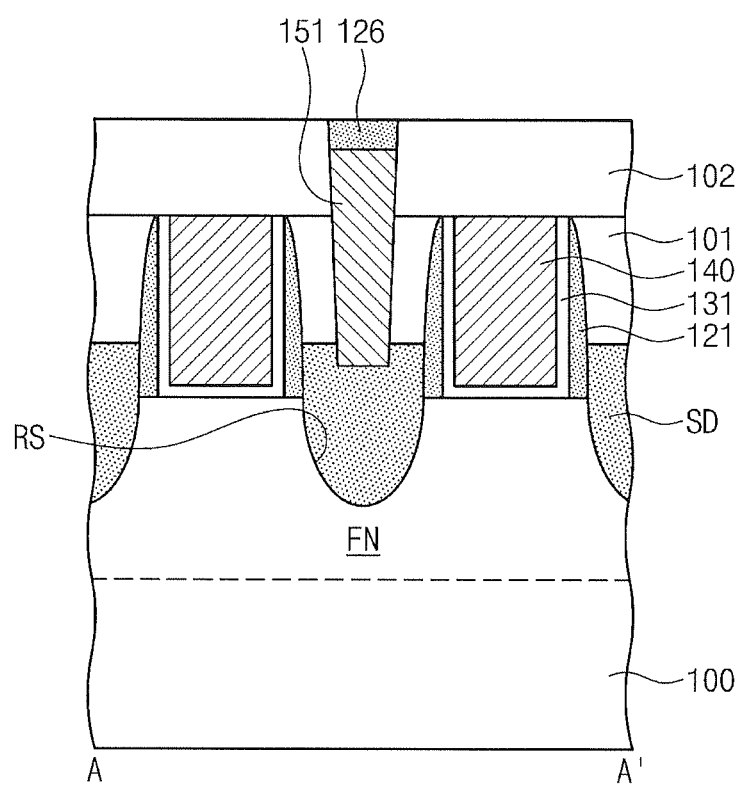

Referring to FIGS. 9 and 14, a second interlayer insulating layer 102 may be formed to cover the first interlayer insulating layer 101. A lower contact 151 may be formed to penetrate the first and second interlayer insulating layers 101 and 102. The lower contact 151 may be connected to the source/drain region SD. The formation of the lower contact 151 may include forming a contact hole penetrating the first and second interlayer insulating layers 101 and 102, and filling the contact hole with a conductive material. A mask pattern 126 covering the lower contact 151 may be formed in an upper portion of the contact hole.

The mask pattern 126 may include a low-k layer formed by the method described with reference to FIGS. 1 to 8. For example, the mask pattern 126 may include a SiOCN layer.

Figure 15:
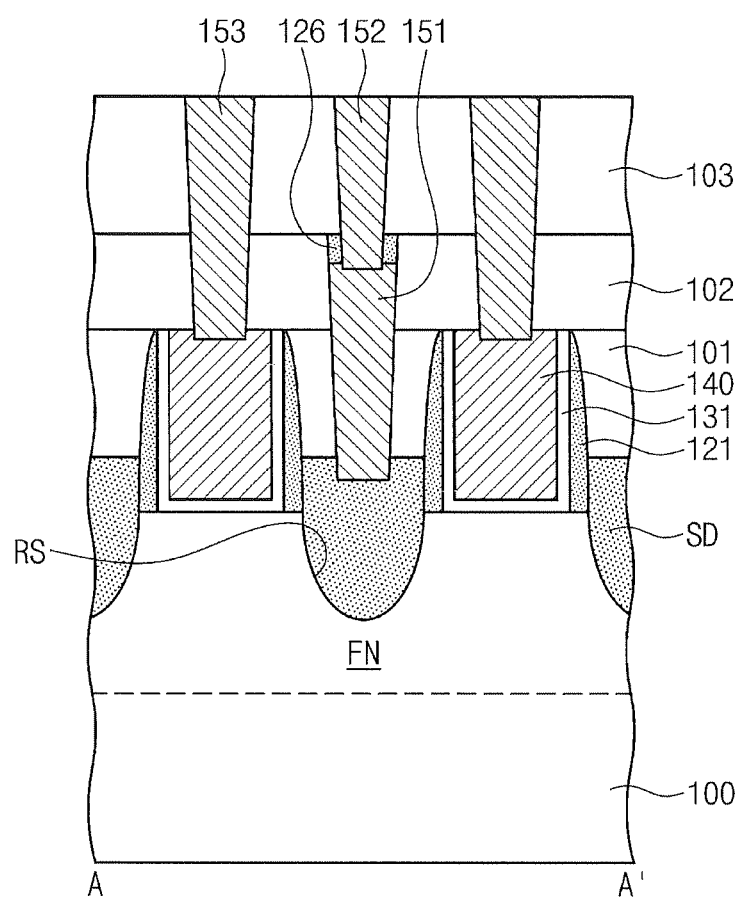

Referring to FIGS. 9 and 15, a third interlayer insulating layer 103 may be formed to cover the second interlayer insulating layer 102. Gate contacts 153 may be formed to penetrate the second and third interlayer insulating layers 102 and 103. The gate contacts 153 may be connected to upper portions of the gate electrodes 140. In addition, an upper contact 152 may be formed to penetrate the third interlayer insulating layer 103. The upper contact 152 may be connected to the lower contact 151. The upper contact 152 may be formed together with the gate contacts 153. A contact hole for the upper contact 152 may be formed simultaneously with contact holes for the gate contacts 153. At this time, since the mask pattern 126 has the high etch resistance, the mask pattern 126 may protect the lower contact 151 during the formation of the contact holes.

Figure 16:
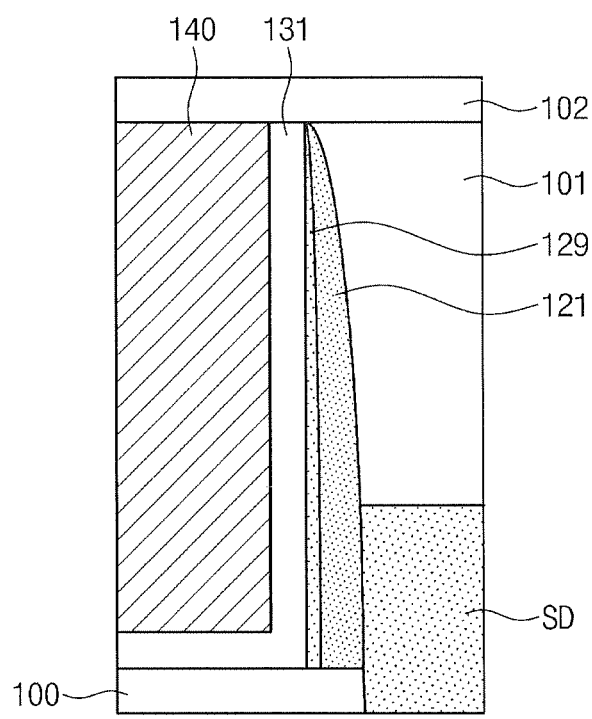
FIG. 16 is an enlarged view of a portion of FIG. 15 to illustrate a gate spacer according to some embodiments of the inventive concepts.

FIG. 16 is an enlarged view of a portion of FIG. 15 to illustrate a gate spacer according to some embodiments of the inventive concepts.

Referring to FIG. 16, a semiconductor device according to the present embodiment may further include an inner spacer 129 disposed between a gate electrode 140 and a gate spacer 121. The inner spacer 129 may be formed of a material different from that of the gate spacer 121. The inner spacer 129 may be formed of a material which does not substantially include carbon. For example, the inner spacer 129 may include a SiN layer or a SiON layer. For example, the SiN layer or the SiON layer may be formed before the formation of the gate spacer layer 120 described with reference to FIG. 10.

According to the embodiments of the inventive concepts, the method of forming the low-k layer may increase both the carbon composition and the oxygen composition in the low-k layer. Thus, the etch resistance of the low-k layer may be improved, and the electrical characteristics of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of forming a low-k layer, the method comprising:
    forming a layer by providing a silicon source, a carbon source, an oxygen source, and a nitrogen source onto a substrate,
    wherein the forming of the layer comprises a plurality of main cycles, wherein each of the main cycles comprises providing the silicon source, providing the carbon source, providing the oxygen source, and providing the nitrogen source, each of which is performed at least one time,
    wherein each of the main cycles comprises sub-cycles in which the providing of the carbon source and the providing of the oxygen source are alternately performed, and wherein the silicon source and the nitrogen source are not provided in the sub-cycles and between the sub-cycles.

2. The method of claim 1, wherein the providing of the oxygen source is performed after the providing of the carbon source in each of the sub-cycles.

3. The method of claim 1, wherein another source is not provided between the providing of the carbon source and the providing of the oxygen source in the sub-cycles.

4. The method of claim 1, wherein the providing of the carbon source is performed for a time of 3 seconds to 100 seconds in each of the sub-cycles.

5. The method of claim 1, wherein the providing of the oxygen source is performed for a time of 3 seconds to 15 seconds in each of the sub-cycles.

6. The method of claim 1, wherein a performance time of the providing of the oxygen source is shorter than a performance time of the providing of the carbon source in each of the sub-cycles.

7. The method of claim 1, wherein the number of the sub-cycles ranges from 5 to 30.

8. The method of claim 1, wherein the providing of the silicon source is performed before the sub-cycles in each of the main cycles.

9. The method of claim 8, wherein the providing of the silicon source is performed for a time of 3 seconds to 50 seconds.

10. The method of claim 1, wherein the providing of the nitrogen source is performed after the sub-cycles in each of the main cycles.

11. The method of claim 10, wherein the providing of the nitrogen source is performed for a time of 3 seconds to 50 seconds.

12. The method of claim 10, wherein each of the main cycles further comprises providing a second carbon source after the providing of the nitrogen source.

13. The method of claim 1, wherein the low-k layer is a SiOCN layer.

14. The method of claim 13, wherein a carbon composition and an oxygen composition of the SiOCN layer have a relationship expressed by Equation 1, $$\text{Carbon composition (at \%)} \geq 21.6 - 0.4 \times (\text{oxygen composition (at \%)}) \quad \text{[Equation 1]}.$$

15. The method of claim 13, wherein a sum of a carbon composition and an oxygen composition of the SiOCN layer ranges from 35 at % to 50 at %.

16. The method of claim 1, further comprising:
performing purge operations between the providing of the silicon source, the providing of the carbon source, the providing of the oxygen source, and the providing of the nitrogen source.

17. A method of forming a low-k layer, the method comprising:
forming a layer by providing a silicon source, a carbon source, an oxygen source, and a nitrogen source onto a substrate,
wherein the forming of the layer comprises a plurality of main cycles, wherein each of the main cycles comprises providing the silicon source, performing a plurality of sub-cycles, and providing the nitrogen source, which are sequentially performed,
wherein each of the sub-cycles comprises providing the carbon source and providing the oxygen source, and
wherein the silicon source and the nitrogen source are not provided in the sub-cycles and between the sub-cycles.

18. A method of forming a semiconductor device, the method comprising:
forming gate patterns on a substrate;
forming a gate spacer layer covering the gate patterns; and
forming gate spacers by etching the gate spacer layer,
wherein the forming of the gate spacer layer comprises a plurality of main cycles, wherein each of the main cycles comprises providing a silicon source, providing a carbon source, providing an oxygen source, and providing a nitrogen source, each of which is performed at least one time,
wherein each of the main cycles comprises sub-cycles in which the providing of the carbon source and the providing of the oxygen source are alternately performed, and
wherein the silicon source and the nitrogen source are not provided in the sub-cycles and between the sub-cycles.

19. The method of claim 18, further comprising:
forming recess regions exposing the substrate between the gate patterns after the forming of the gate spacers.

* * * * *